(12) United States Patent
Yamagishi et al.

(10) Patent No.: US 6,945,746 B2
(45) Date of Patent: Sep. 20, 2005

(54) SEMICONDUCTOR MANUFACTURING EQUIPMENT AND MAINTENANCE METHOD

(75) Inventors: Takayuki Yamagishi, Tama (JP); Takeshi Watanabe, Tama (JP); Masaei Suwada, Tama (JP)

(73) Assignee: ASM Japan K.K., Tokyo (JP)

( * ) Notice: Subject to any disclaimer, the term of this patent is extended or adjusted under 35 U.S.C. 154(b) by 49 days.

(21) Appl. No.: 10/371,050

(22) Filed: Feb. 20, 2003

(65) Prior Publication Data

US 2003/0168948 A1 Sep. 11, 2003

(30) Foreign Application Priority Data

Feb. 21, 2002 (JP) ........................................ 2002-044928

(51) Int. Cl.[7] ............................................. B65G 49/07
(52) U.S. Cl. ........................ 414/935; 414/217; 454/187
(58) Field of Search ................................ 414/935, 414, 414/212; 454/187; 312/249.9, 330.1, 265.4, 311, 334.27, 334.29, 334.31, 334.32, 334.34

(56) References Cited

U.S. PATENT DOCUMENTS

| | | | | |
|---|---|---|---|---|
| 4,934,767 A | * | 6/1990 | Hoyt et al. .............. 312/330.1 |
| 5,061,845 A | * | 10/1991 | Pinnavaia ................... 235/492 |
| 5,174,045 A | * | 12/1992 | Thompson et al. ............ 34/58 |
| 5,208,732 A | * | 5/1993 | Baudouin et al. ........... 361/704 |
| 6,439,824 B1 | * | 8/2002 | Harris et al. ........... 414/416.03 |

* cited by examiner

Primary Examiner—Peter M. Cuomo
Assistant Examiner—Erika Garrett
(74) Attorney, Agent, or Firm—Knobbe Martens Olson & Bear, LLP (57) ABSTRACT

The equipment comprises a semiconductor-processing device in which a load-lock chamber, a transfer chamber and a reaction chamber are modularized into, a main frame, a stand-alone chamber frame on which the semiconductor-processing device is placed, a sliding mechanism for enabling attaching/removing of the chamber frame to/from the main frame smoothly, and a positioning mechanism for fixing a position of the chamber frame. This enables the processing device to be attached and removed at will. The method comprises pulling out from the main frame the chamber frame, on which the modularized semiconductor-processing device is placed; forming a maintenance space inside the main frame; maintaining the semiconductor-processing device and peripherals attached in the vicinity of the main frame, and putting the chamber frame with the processing device back into the main frame.

10 Claims, 7 Drawing Sheets

SEMICONDUCTOR MANUFACTURING EQUIPMENT AND MAINTENANCE METHOD

BACKGROUND OF THE INVENTION

1. Field of the Invention

The present invention relates to a device for installing a modularized semiconductor-processing device on a main frame and a method for maintaining the modularized semiconductor-processing device and peripherals.

2. Description of the Related Art

Figures 1A, 1B, 1C:
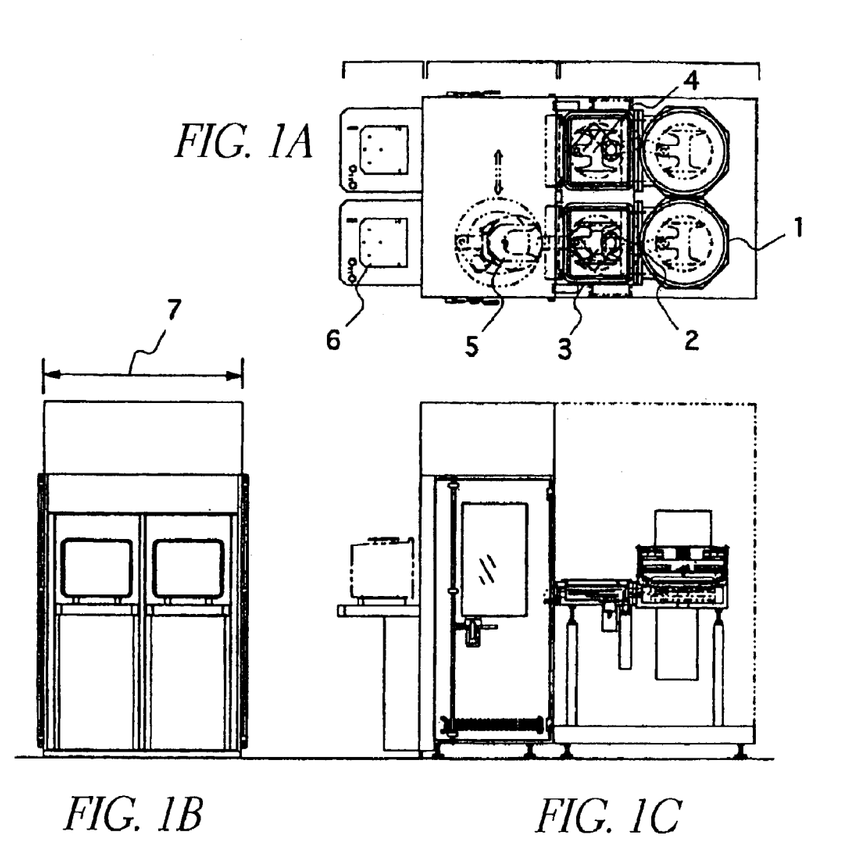
FIG. 1 shows conventional modularized semiconductor manufacturing equipment.

In Japanese Patent Application No. 2001-196802, which is incorporated herein by reference, there is disclosed modularized semiconductor manufacturing equipment including a load-lock chamber, a transferring mechanism and a reaction chamber. FIG. 1 shows compact single-wafer-processing type semiconductor manufacturing equipment for forming a thin film on a semiconductor substrate, which is disclosed in the above-mentioned reference. FIG. 1(a) is a plan view, FIG. 1(b) is a front view, and FIG. 1(c) is a side view of the equipment respectively. This equipment comprises a modularized reactor unit, an AFE portion [the portion which includes an atmosphere robot 5 for carrying in/out a substrate from within a cassette or a front opening unified pad (FOUP) 6 into/from a load-lock chamber] and a load boat in which the cassette or the FOUP 6 is positioned. The reactor unit is modularized by connecting two adjacent units. Each of the units comprises a reactor 1 for growing a film on a semiconductor substrate, a load-lock chamber 3 used for keeping the semiconductor substrate ready in vacuum, which is directly connected with the reactor 1 via a gate valve 2, and a wafer handler 4, which is positioned inside the load-lock chamber 3. The wafer handler has one thin link-type arm for transferring a semiconductor substrate into the reactor 1 and moves the substrate in a straight-line direction. Modularizing the reactor units minimizes dead space inside the reactor unit and reduction in a faceprint 7 of the entire equipment.

Figure 2A:
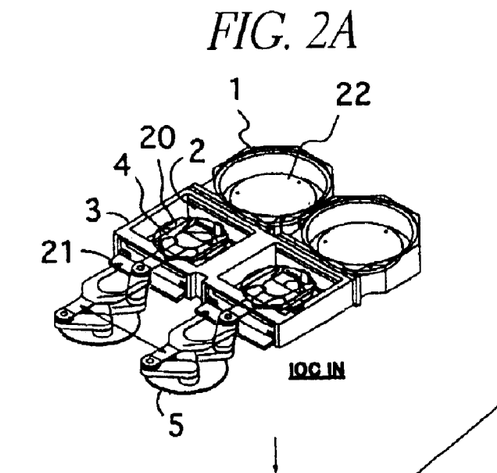
FIG. 2 shows an operation sequence of conventional modularized semiconductor manufacturing equipment.
Figure 2B:
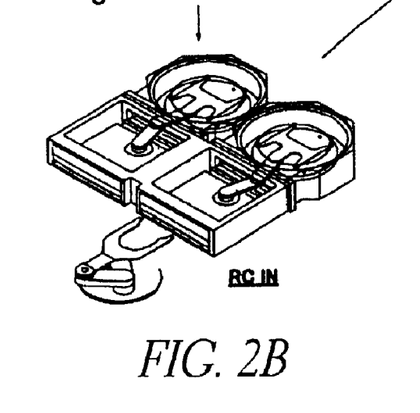
Figure 2C:
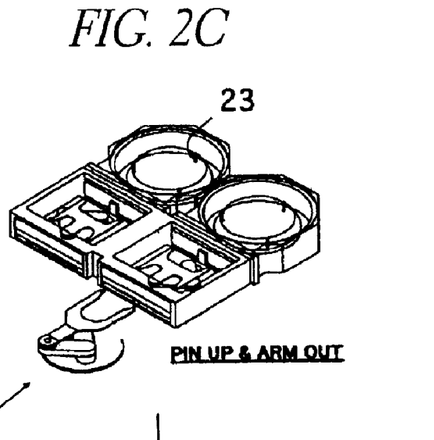
Figure 2D:
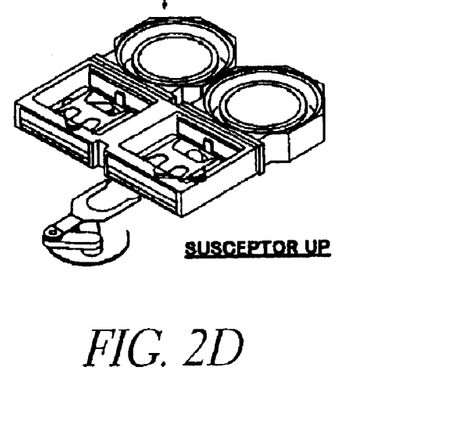

FIGS. 2(a) to (d) illustrate the operation sequences of the semiconductor manufacturing equipment disclosed in the above-mentioned reference. In FIG. 2(a), the atmosphere robot 5 carries a semiconductor substrate 20 from a cassette or a FOUP into respective load-lock chambers 3 via a flapper valve 21. After this is completed, the flapper valve 21 is closed and air in the load-lock chamber 3 is evacuated. In FIG. 2(b), the gate valve 2 is opened and the semiconductor substrate is transferred onto a susceptor 22 inside the reactor 1 by a wafer handler mechanism 4. Because the wafer handler only reciprocates between the load-lock chamber and the reactor in a straight-line direction, only positioning is required, and no complicated teaching and adjustment are required. In FIG. 2(c), wafer support pins 23 protrude from a susceptor surface and support the semiconductor substrate 20. The arms of the wafer handler mechanism 4 are housed in the load-lock chamber and the gate valve is closed. In FIG. 2(d), the susceptor 22 is raised and the semiconductor substrate 20 is placed on the surface of the susceptor 22. Afterward, a thin film formation onto the semiconductor substrate 20 is started. After thin film formation is completed, the processed semiconductor substrate is transferred to a cassette or a FOUP in a reverse sequence of FIGS. 2(d)→(c)→(b)→(a). In addition to a single-wafer-processing type, the modularized semiconductor-processing device is capable of handling multiple substrates simultaneously and of executing deposition processing simultaneously. Consequently, device throughput is high, and stable processes are provided.

Generally, conventional load-lock type semiconductor manufacturing equipment comprised a load-lock chamber, a transfer chamber and a reaction chamber, and each chamber was directly attached to the main frame. Because of the construction, the only way of performing equipment maintenance was from the outside. Consequently, providing a space for maintenance work outside the equipment was required. Additionally, there was dead space in which no one was able to get in the center portion of the main frame, causing a problem that equipment footprint was increased when two units or more of the equipment were arranged transversely.

When maintenance is performed, workers are compelled to do jobs within such narrow area and work becomes extremely difficult when a critical failure occurs. As a result, equipment downtime lengthens and throughput declines.

The present invention was achieved in view of the above-mentioned problems. The object of the present invention is to provide semiconductor manufacturing equipment for which maintenance work can be performed easily and a maintenance method for the same.

The second object of the present invention is to provide compact semiconductor manufacturing equipment for which there is no space for maintenance required and no dead space, hence the entire equipment footprint is small.

The third object of the present invention is to provide semiconductor manufacturing equipment which reduces the time required for manufacturing devices and maintenance and improves throughput and a maintenance method for the same.

SUMMARY OF THE INVENTION

To achieve the above-mentioned objects, the semiconductor manufacturing equipment according to the present invention comprises a semiconductor-processing device in which a load-lock chamber, a transfer chamber and a reaction chamber are modularized into a main frame, a stand-alone chamber frame on which the semiconductor-processing device is placed, a sliding mechanism for enabling attaching/removing of the chamber frame to/from the main frame smoothly, and a positioning mechanism for fixing a position of the chamber frame, and which is characterized in that the modularized semiconductor-processing device is installed on the main frame in a manner that it can be attached and removed at will.

Preferably, the sliding mechanism comprises a guide component attached to the sliding surface of the bottom of the main frame and bearings or resin plates, which are attached to the sliding surface of the bottom of the chamber frame.

Preferably, the positioning mechanism comprises a bearing for positioning a y-axis direction, which is provided on the contact surface of the bottom of the main frame and wedge-shaped blocks for positioning x-axis and the z-axis directions.

Multiple units of the semiconductor manufacturing equipment can be arranged transversely with no space between the units.

The method for maintaining the semiconductor manufacturing equipment comprises the steps of pulling out the chamber frame, on which the modularized semiconductor-processing device is placed, from the main frame; forming a maintenance space inside the main frame; maintaining the semiconductor-processing device and peripherals attached in the vicinity of the main frame; and putting the chamber frame, on which the modularized semiconductor-processing device is placed, back into the main frame.

DETAILED DESCRIPTION OF THE INVENTION

Referring to FIG. 3, the preferred semiconductor manufacturing equipment 30 according to the present invention comprises a main frame 31, a modularized semiconductor-processing device 32 and a chamber frame 33 on which the semiconductor-processing device 32 is placed. A pair of spaced guides or rails 34 are attached respectively to the opposing bottom main frame members along an x-axis direction of the main frame 31. Bearings or resin plates reducing friction resistance are installed on sliding surfaces 35 of the chamber frame, which slide along the guides 34 of the main frame 31, enabling smooth sliding of the surfaces 35 or guides 34. With this sliding mechanism, the modularized semiconductor-processing device 32 is installed in a manner that it can be attached and removed at will.

Wedge-shaped blocks 36 are attached to bottom main frame members along a y-axis direction, in which the chamber frame 33 contacts inside the main frame 31. Positioning of the x-axis direction and the y-axis direction of the chamber frame 33 is determined by the block 36 fitting in a concave portion 302 provided in the chamber frame 33. A bearing 37 is attached to the center of the wedge-shaped block 36 of the main frame. Positioning of a y-axis direction of the chamber frame 33 is determined by the bearing 37 fitting in a concave portion 301 provided in the chamber frame 33. Two spaced pressing blocks 38 are attached to bottom main frame members along the y-axis direction adjacent the ends of the guides 34. The pressing blocks 38 function so that the bottom frame along a y-axis direction of the chamber frame 33 is pressed against the main frame 31 after the chamber frame 33 is completely installed inside the main frame 31. By this function, positioning of an x-axis direction and a y-axis direction of the chamber frame 33 inside the main frame 31 is determined. With the positioning mechanism, re-teaching of an AFE robot for enabling the chamber frame once pulled out to be fixed at the identical position can be eliminated.

Figure 3A:
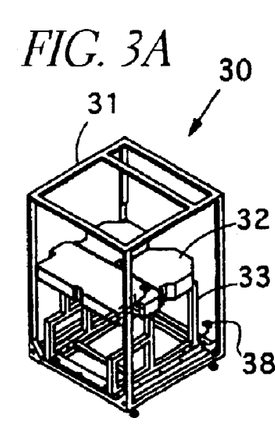
FIG. 3 shows a preferred embodiment and a maintenance sequence of the semiconductor manufacturing equipment according to the present invention.
Figure 3B:
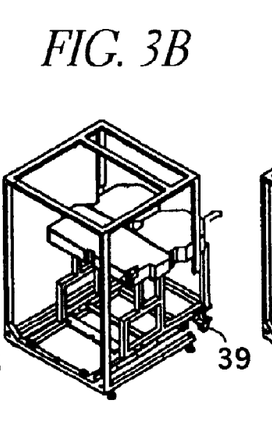
Figure 3C:
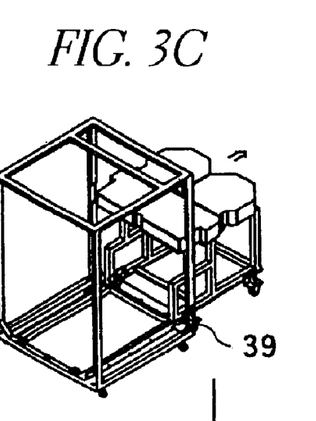
Figure 3D:
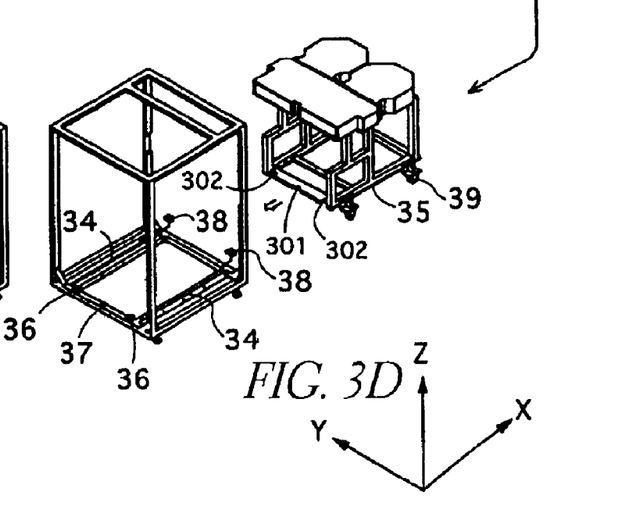
Figure 3E:
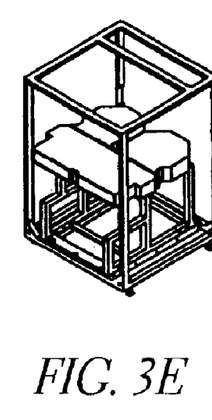

FIGS. 3(a) and (e) show that, when the modularized semiconductor-processing device 32 is installed, it is loaded inside the main frame 31 with no space between them.

Thus, the modularized semiconductor-processing device 32 is integrated with the chamber frame 33, and it can be moved freely and separately from the main frame 31 by attaching casters 39 at its bottom. This feature facilitates a worker to perform adjustment work of a reactor and a load-lock chamber by pulling out the modularized semiconductor-processing device from the main frame 31. At the time of a serious failure, an entire assembly can be replaced by replacing a module.

Figure 4A:
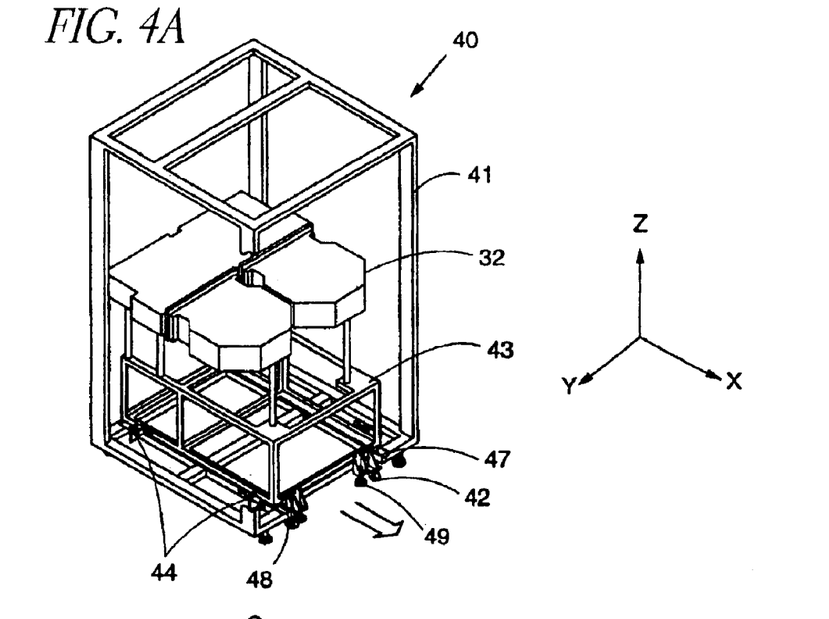
FIG. 4 shows another preferred embodiment and a maintenance sequence of the semiconductor manufacturing equipment according to the present invention.
Figure 4B:
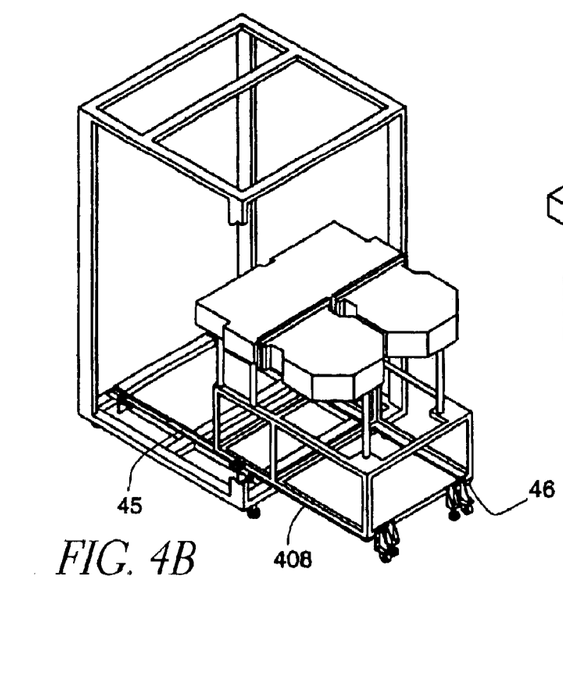
Figure 4C:
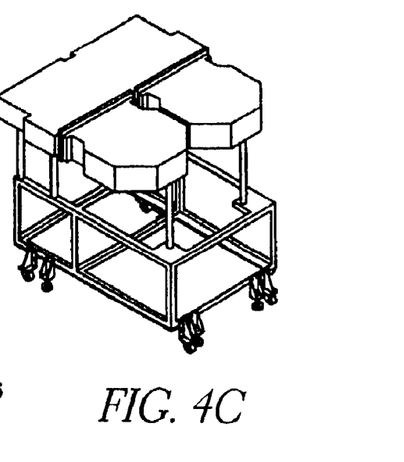

FIG. 4 shows another embodiment of the semiconductor manufacturing equipment according to the present invention. The semiconductor manufacturing equipment 40 comprises a main frame 41, a modularized semiconductor-processing device 32 and a chamber frame 43 on which the semiconductor-processing device 32 is placed. A V-shaped groove 47 is provided along an x-axis direction on the bottom of the main frame 41. A flat groove 48 is provided on the bottom of the main frame 41 opposing the V-shaped groove 47 along an x-axis direction. The V-shaped groove 47 and the flat groove 48 function as a positioning mechanism in the y-axis direction of the chamber frame 43 as well. Bearings or resin plates are attached to the V-shaped groove 47 and the flat groove 48 for reducing friction resistance, enabling smooth sliding of the V-shaped groove 47 and the flat groove 48 along the sliding surfaces 408 of the chamber plate. With this sliding mechanism, the modularized semiconductor-processing device 32 is installed on the main frame 41 in a manner that it can be attached and removed at will. Shock absorbers 44 are attached to side surfaces of the V-shaped groove 47 and the flat groove 48 of the main frame 41 so that the main frame 41 does not experience a shock caused by inertia when the chamber frame 43 is installed.

Casters 42 are attached at the rear end of the bottom of the chamber frame 43. The casters 42 provide a support when the chamber frame 43 is pulled out and function as a positioning plate in the x-axis direction when the chamber frame 43 is installed. A leveling adjuster 49 is attached so that leveling in a z-axis direction can be done by the chamber frame alone when a chamber is assembled, etc. One sliding surface 46 of the chamber frame 43 protrudes in a V-shape to accommodate the V-shaped groove 47 of the main frame 41. With the sliding surface 46 protruding in the V-shape sliding with the V-shaped groove 47, positioning of a y-axis direction of the chamber frame 43 is determined. With the positioning mechanism, re-teaching of an AFE robot for enabling the chamber frame once pulled out to be fixed at the identical position can be eliminated.

FIG. 4(a) demonstrates that the modularized semiconductor-processing device 32 is loaded with no space between inside the main frame 41 at the time of installation.

The modularized semiconductor-processing device 32 is integrated with the chamber frame 43. By attaching casters 42 at its bottom, the device can be moved freely and separately from the main frame 41 (FIG. 4(c)). This feature facilitates the worker to perform adjustment work of a reactor and a load-lock chamber by pulling out the modularized semiconductor-processing device from the main frame 41. At the time of a serious failure, an entire assembly can be replaced by replacing a module.

Returning to FIG. 3, a maintenance method of the semiconductor manufacturing equipment according to the present invention is described. First, preparatory for pulling out the chamber frame 33 from the main frame 31, the pressing blocks 38 are released (FIG. 3(a)). While the chamber frame 33 is pulled out gradually, casters 39 are attached to the rear end of the bottom of the chamber frame (FIG. 3(b)). By pulling out the chamber frame 33 further, casters 39 are attached to the front end of its bottom (FIG. 3(c)). With the chamber frame pulled out completely, maintenance of the load-lock chamber, the reactor and peripherals of the main frame is performed (FIG. 3(d)). Lastly, the chamber frame is installed by positioning it inside the main frame 31, and is fixed with the pressing blocks (FIG. 3(e)).

Figure 5:
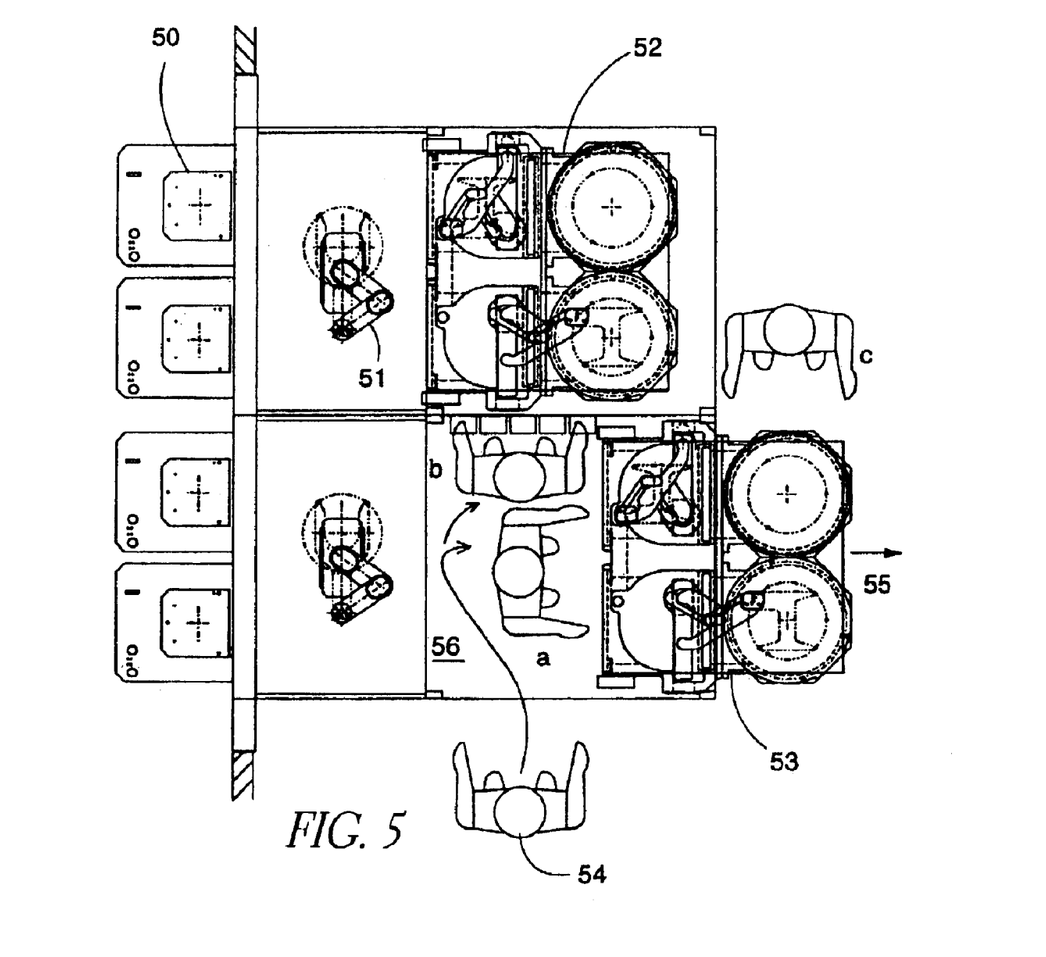
FIG. 5 is a plan view of two units of the semiconductor manufacturing equipment according to the present invention arranged and a maintenance method for this arrangement.
Figure 6:
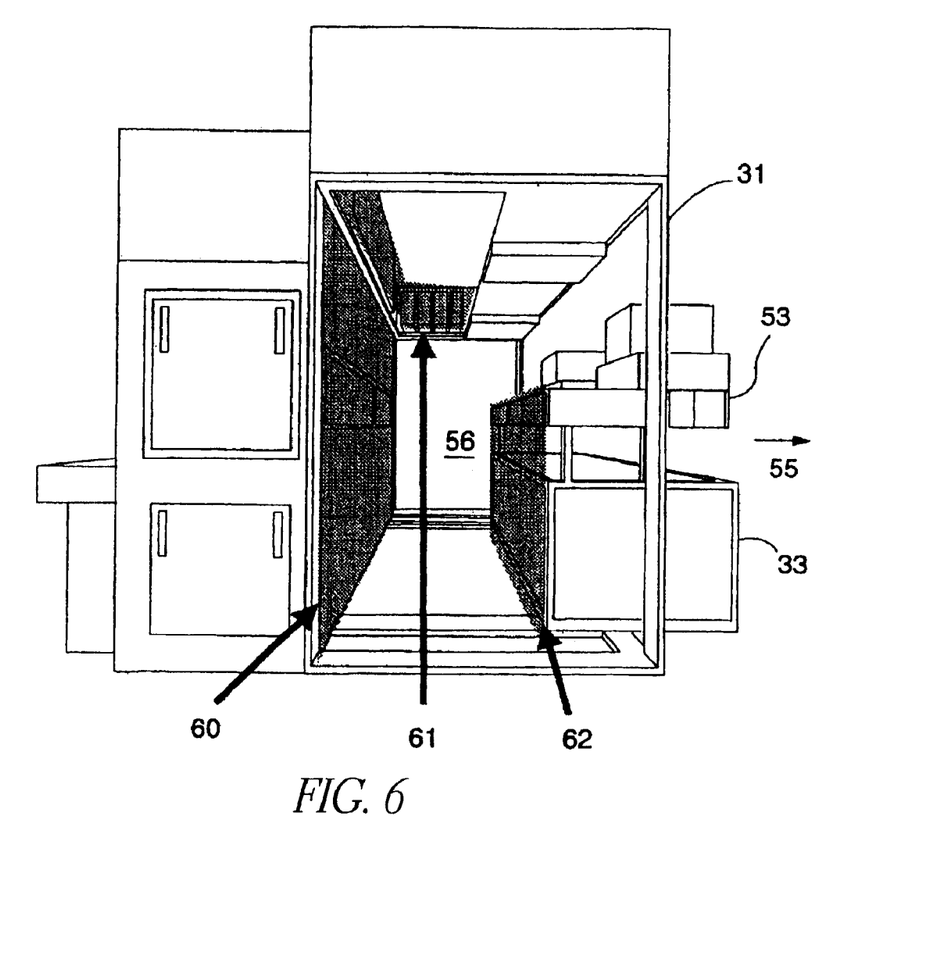
FIG. 6 is a side view of two units of the semiconductor manufacturing equipment according to the present invention arranged and maintenance spaces for performing maintenance work.

FIG. 5 and FIG. 6 illustrate a maintenance method when two units of the semiconductor manufacturing equipment according to the present invention are arranged transversely. FIG. 5 shows a plan view of the entire semiconductor manufacturing equipment. FIG. 6 shows its side view. The entire semiconductor manufacturing equipment comprises a load boat portion in which cassettes or FOUP's 50 are positioned, an AFE portion including atmosphere robots 51, and a modularized reactor unit portion 52. FIG. 5 and FIG. 6 show a position in which one of the reactor units 53 of the semiconductor manufacturing equipment according to the present invention is pulled out halfway. By pulling out the reactor unit 53 in an arrow 55 direction, a maintenance space 56 is formed inside the main frame. By entering the maintenance space 56, a worker 54 can perform maintenance work. For example, the worker 54 can perform maintenance work of the load-lock side 62 of the reactor unit 53 pulled out as indicated by a. Or, the worker 54 can perform maintenance work of the AFE side 60, which is an opposite side of the load-lock side. The worker 54 can perform maintenance work of electrical components, etc. installed on a ceiling portion 61 of the main frame as indicated by b. From outside the main frame, the worker can perform maintenance work of the reactor portion of the reactor unit 53 pulled out as indicated by c. After maintenance work is completed, by putting the reactor unit 53 back to its original position inside the main frame, the maintenance space 56 disappears.

Thus, using the semiconductor manufacturing equipment according to the present invention, a maintenance space can be formed only when maintenance work is performed, hence the footprint of the entire equipment can be minimized. Additionally, because maintenance can be performed exceedingly easily and effectively, work hours are shortened and throughput of the semiconductor manufacturing equipment improves.

Figure 7:
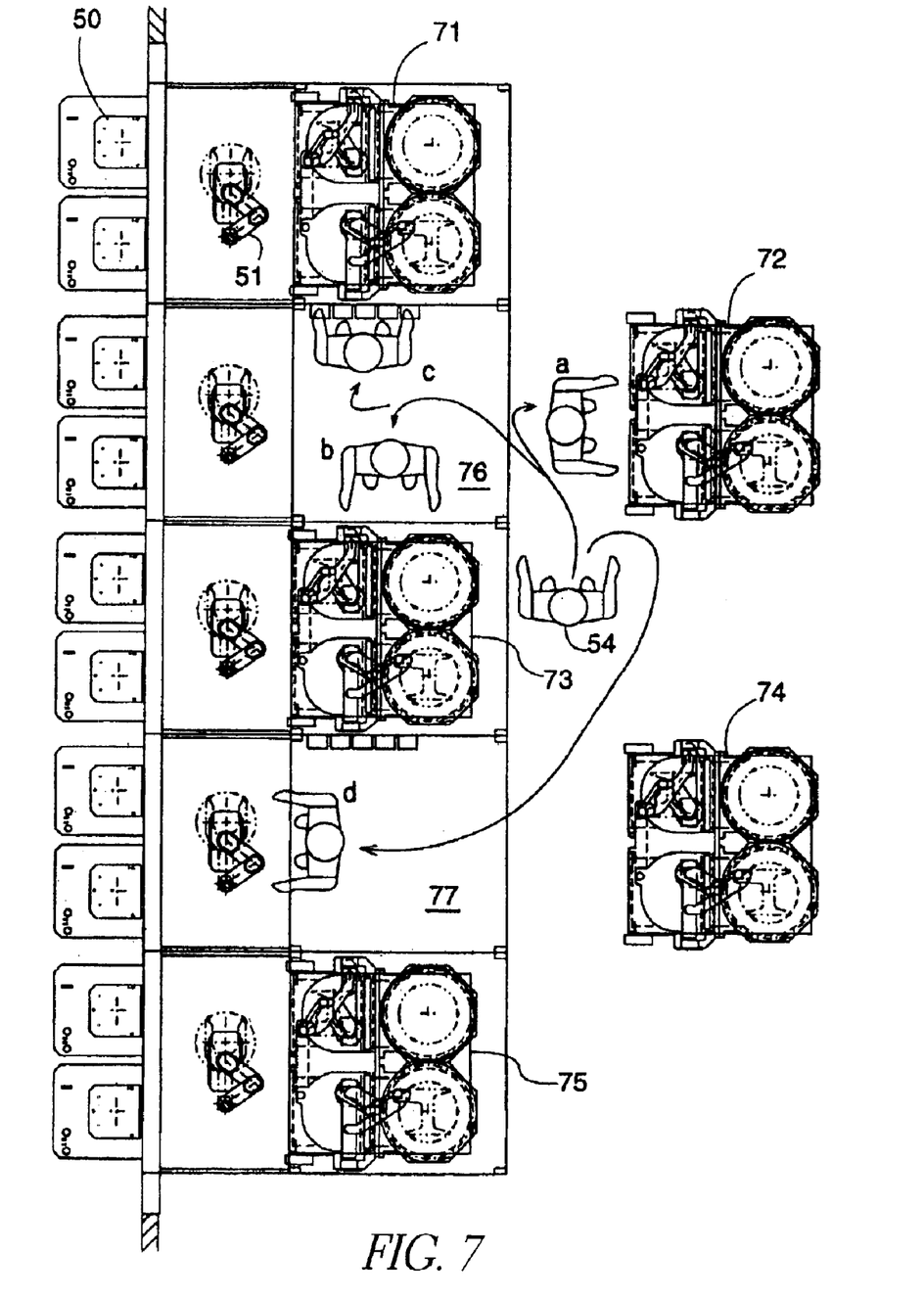
FIG. 7 is a plan view of multiple units of the semiconductor manufacturing equipment according to the present invention arranged and a maintenance method for this arrangement.

FIG. 7 shows a plan view of the entire equipment and a maintenance method when five units of the semiconductor manufacturing equipment (71, 72, 73, 74, and 75) according to the present invention are arranged transversely with no space between the units. In this case, reactor units 72 and 74 for which maintenance work is performed are pulled out completely. As shown in FIG. 7, when multiple reactor units are arranged with no space between, maintenance work of two units at both ends (71, 75) can be performed by pulling them out halfway as shown in FIG. 5. Maintenance work of other three reactor units (72, 73, and 74) can be performed by pulling them out completely. By pulling out reactor units 72 and 74, maintenance spaces 76 and 77 are respectively formed. The worker 54 can perform maintenance work of the load-lock side of the reactor units pulled out as indicated by a. The worker 54 can perform maintenance work of the chamber of the adjoining reactor unit from a side as indicated by b. The worker 54 can perform maintenance work of electrical components attached midway in the main frame as indicated by c. The worker 54 can perform maintenance work of the atmosphere robot on the AFE side and other devices as indicated by d. After maintenance work is completed, by putting the reactor units 72 and 74 back to their original positions inside the main frame, the maintenance spaces 76 and 77 disappear.

Thus, the semiconductor manufacturing equipment according to the present invention enables arranging of multiple units of semiconductor manufacturing equipment transversely and the footprint of the entire equipment can be minimized. Additionally, because a maintenance space can be formed inside the main frame by selectively pulling out chamber frames for which maintenance work is required, maintenance work can be performed exceedingly easily and effectively. Consequently, work hours required for maintenance are shortened and throughput of the equipment improves.

Using the semiconductor manufacturing equipment and the maintenance method according to the present invention, maintenance can be performed exceedingly easily and effectively.

Additionally, the semiconductor manufacturing equipment according to the present invention does not have a space for maintenance use and dead space. The footprint of the entire equipment is small and compact.

EXPLANATION OF SYMBOLS USED

30 Semiconductor manufacturing equipment
31 Main frame
32 Modularized semiconductor processing device
33 Chamber frame
34 Guide component
35 Sliding surface
36 Wedge-shaped block
37 Bearing
38 Pressing block
39 Caster
40 Concave portion
41 Concave portion

What is claimed is:

1. Semiconductor manufacturing equipment comprising:
   a modular main frame;
   a modular stand-alone chamber frame;
   a semiconductor processing device including a reaction chamber for depositing a film on a semiconductor substrate, said semiconductor processing device being mounted on said chamber frame;
   said frames being configured so that said chamber frame is smoothly movable into and out of said main frame; and
   a positioning mechanism for accurately fixing a portion of said chamber frame within said main frame.

2. The equipment of claim 1 including a sliding mechanism for enabling attaching and removing said chamber frame to and from said main frame.

3. The semiconductor manufacturing equipment as claimed in claim 2, wherein said sliding mechanism comprises guide components attached to sliding surfaces of the bottom of said main frame and bearings or resin plates, which are attached to the sliding surfaces of the bottom of said chamber frame.

4. Semiconductor manufacturing equipment comprising:
   a modular main frame;
   a modular stand-alone chamber frame;
   a semiconductor processing device including a reaction chamber mounted on said chamber frame;
   said frames being configured so that said chamber frame is smoothly movable into and out of said main frame; and a positioning mechanism for accurately fixing a portion of said chamber frame within said main frame, wherein said sliding mechanism and said positioning mechanism comprise a flat groove provided on either of the sliding surfaces of the bottom of said main frame, a V-shaped groove provided on the other sliding surface of said main frame, bearings or resin plates attached to said flat groove and the V-shaped groove, and a V-shaped protruding portion provided on the sliding surface of said chamber frame to correspond to said V-shaped groove, and said flat groove and said V-shaped groove enable positioning of a y-axis direction of said chamber frame.

5. Semiconductor manufacturing equipment comprising:

a modular main frame;

a modular stand-alone chamber frame;

a semiconductor processing device including a reaction chamber mounted on said chamber frame;

said frames being configured so that said chamber frame is smoothly movable into and out of said main frame; and a positioning mechanism for accurately fixing a portion of said chamber frame within said main frame, wherein said positioning mechanism comprises a bearing for positioning a y-axis direction and wedge-shaped blocks for positioning x-axis and z-axis directions, which are provided on the contact surfaces of the bottom of said main frame.

6. The semiconductor manufacturing equipment as claimed in claim 4, which further comprises casters attached to the rear end of the bottom of said chamber frame and said casters enable positioning of the x-axis direction of said chamber frame.

7. The equipment of claim 1 wherein said processing device includes a load-lock mechanism joined to said reaction chamber and movable with said reaction chamber on said chamber frame into and out of said main frame.

8. Semiconductor manufacturing equipment comprising:

a modular main frame;

a modular stand-alone chamber frame;

a semiconductor processing device including a reaction chamber mounted on said chamber frame;

said frames being configured so that said chamber frame is smoothly movable into and out of said main frame; and a positioning mechanism for accurately fixing a portion of said chamber frame within said main frame, wherein said processing device includes a load-lock mechanism joined to said reaction chamber and movable with said reaction chamber on said chamber frame into and out of said main frame, said equipment further comprising an atmospheric robot chamber adjacent said load-lock chamber that becomes accessible for maintenance when said chamber frame is moved out of said main frame.

9. The semiconductor manufacturing equipment as claimed in any one of claims 1 to 8, which is characterized in that multiple units of said semiconductor manufacturing equipment are arranged transversely with substantially no space between the units.

10. A method for maintaining said semiconductor manufacturing equipment as claimed in any one of claims 1 to 9, which comprises the steps of:

moving out the chamber frame, on which said semiconductor-processing device is placed, from said main frame;

forming a maintenance space inside said main frame;

maintaining said semiconductor-processing device and peripherals attached in the vicinity of said main frame; and putting said chamber frame, on which said modularized semiconductor-processing device is placed, back into said main frame.

* * * * *